United States Patent
Klassen et al.

(10) Patent No.: US 6,331,680 B1
(45) Date of Patent: Dec. 18, 2001

(54) MULTILAYER ELECTRICAL INTERCONNECTION DEVICE AND METHOD OF MAKING SAME

(75) Inventors: David John Klassen, Dexter; Morgan Merritt Whitney, Jr., Grosse Pointe; Thomas Randall Peterman, Belleville; Paul Earl Pergande, Beverly Hills; David Robert Collins, Brownstown, all of MI (US)

(73) Assignee: Visteon Global Technologies, Inc., Dearborn, MI (US)

(*) Notice: Subject to any disclaimer, the term of this patent is extended or adjusted under 35 U.S.C. 154(b) by 676 days.

(21) Appl. No.: 08/689,164

(22) Filed: Aug. 7, 1996

(51) Int. Cl.$^7$ .................................................. H01R 12/04
(52) U.S. Cl. ......................... 174/261; 361/792; 428/901
(58) Field of Search .................. 174/255, 257, 174/260, 261, 35 R, 51; 361/792, 793, 794, 795, 818; 428/901; 427/448, 449

(56) References Cited

U.S. PATENT DOCUMENTS

| | | | |
|---|---|---|---|
| 3,872,419 | 3/1975 | Groves et al. | 338/25 |
| 4,101,731 | 7/1978 | Marancik . | |
| 4,166,880 | 9/1979 | Loferski et al. | 428/457 |
| 4,176,029 | 11/1979 | Jillie, Jr. . | |
| 4,263,341 | 4/1981 | Martyniak | 427/97 |
| 4,311,727 | 1/1982 | Lazzari | 427/58 |
| 4,328,531 * | 5/1982 | Nagashima et al. | 361/762 |
| 4,421,785 | 12/1983 | Kroger . | |
| 4,464,701 | 8/1984 | Roberts et al. | 361/313 |
| 4,511,599 | 4/1985 | Rustomji . | |
| 4,525,383 | 6/1985 | Saito | 257/750 |
| 4,529,686 | 7/1985 | Kraus . | |
| 4,532,152 | 7/1985 | Elarde | 427/96 |
| 4,551,789 | 11/1985 | Schettler et al. . | |
| 4,670,297 | 6/1987 | Lee et al. . | |
| 4,685,197 | 8/1987 | Tigelaar et al. | 437/195 |
| 4,754,318 * | 6/1988 | Momose et al. | 257/775 |
| 4,933,318 | 6/1990 | Heijman . | |
| 4,977,105 * | 12/1990 | Okamoto et al. | 438/639 |
| 4,983,252 | 1/1991 | Masui et al. . | |
| 5,084,323 * | 1/1992 | Nagasaka et al. | 428/137 |
| 5,200,580 * | 4/1993 | Sienski | 174/264 |
| 5,278,140 | 1/1994 | Chaudhari et al. . | |
| 5,316,975 * | 5/1994 | Maeda | 148/DIG. 50 |
| 5,324,536 | 6/1994 | Yonehara . | |
| 5,380,564 | 1/1995 | VanKuiken, Jr. | 427/456 |
| 5,391,841 | 2/1995 | Quick | 174/258 |
| 5,399,530 * | 3/1995 | Kenmotsu | 438/625 |
| 5,432,149 | 7/1995 | Schuller et al. . | |
| 5,446,016 | 8/1995 | Tanaka et al. . | |
| 5,512,540 | 4/1996 | Yamazaki . | |
| 5,601,672 * | 2/1997 | Casey et al. | 156/89 |

FOREIGN PATENT DOCUMENTS

| | | |
|---|---|---|
| 0568385-A2 | 11/1983 | (EP) . |
| 61207044 | 9/1986 | (EP) . |
| 2022888 | 1/1990 | (EP) . |
| 0540261-A2 | 5/1993 | (EP) . |
| 9407611-A | 4/1994 | (WO) . |

OTHER PUBLICATIONS

Printed Circuit, McGraw–Hill Encyclopedia of Electronics and Computers, C. Duncan; Richard B. Nichols; pp. 636–645; 1984.

* cited by examiner

Primary Examiner—Dean A. Reichard
Assistant Examiner—Dhiru R Patel
(74) Attorney, Agent, or Firm—Larry I. Shelton (57) ABSTRACT

A multilayer, monolithic electrical interconnection device includes a substrate and a plurality of overlaying, alternating conducting and insulating layers deposited atop the substrate and one another. The layers are deposited by thermal spraying of respective insulating or conducting material through defined apertures in respective spray masks. Interlayer electrical connections are intrinsically formed by direct metallurgical bonding between the conducting material of an overlaying layer and the conducting material of a previously sprayed layer.

8 Claims, 11 Drawing Sheets

FIG. 21

MULTILAYER ELECTRICAL INTERCONNECTION DEVICE AND METHOD OF MAKING SAME

TECHNICAL FIELD

This invention relates generally to multilayer electrical interconnection devices. More particularly, the present invention relates to a multilayer electrical interconnection device and a method of fabricating the same through the use of thermal spray technology. The fabricated multilayer interconnection device is particularly suited for use in the design and manufacture of high quality, low cost Automotive Electrical Distribution system components (AEDs) and Automotive Electronic Modules (AEMs) with high current carrying capability.

BACKGROUND

The use of circuit boards in manufacturing electronic equipment provides many advantages, including minimal size and weight, high reliability, and suitability for automated production. A circuit board comprises an insulating layer carrying conductive metal traces and bonding locations for electrical components. With advances in electronics, particularly in the miniaturization of integrated circuits, a need for multilayer boards has arisen to accommodate the high number of circuit interconnections per unit of surface area on a board.

Multilayer circuit boards utilize separate trace patterns on various layers in three dimensions and layer-to-layer interconnects (i.e., vias or plated throughholes) to implement complex interconnections in a small space. Multilayer circuit boards have been manufactured by laminating separate boards together and by a monolithic, plated-up technique. The higher cost and difficult production processes associated with prior art multilayer circuit boards, however, have limited their utility.

The size and thickness of metal traces determines the magnitude of electrical current that can be safely carried. Thus, it would be desirable to be able to arbitrarily control the size and thickness of conductors within a multilayer structure to carry arbitrary amounts of current.

SUMMARY OF THE INVENTION

The present invention has the advantage of providing a multilayer electrical interconnection device having a relatively inexpensive and simple production method and resulting in a monolithic, multilayer device capable of carrying a relatively large amount of current.

In one aspect, the present invention provides a multilayer electrical interconnection device and method of making the same by application of thermal spray materials through positive and negative masks, respectively, to form conductive areas and vias, and insulating layers such that inter-layer direct metallurgical bonding between conducting layers intrinsically result.

The device fabrication method includes the initial provision of a substrate. Thereafter, a plurality of alternating insulating and conducting layers are deposited atop the substrate and one another by thermal spraying of respective insulating or conducting material through correspondingly defined apertures in spray masks. Inter-layer electrical interconnections are intrinsically formed by direct metallurgical bonding between the conducting material of an overlying layer and the conducting material of a previously sprayed layer. The defined apertures are formed through the use of positive and negative masking systems.

DETAILED DESCRIPTION OF PREFERRED EMBODIMENTS

Figure 1:
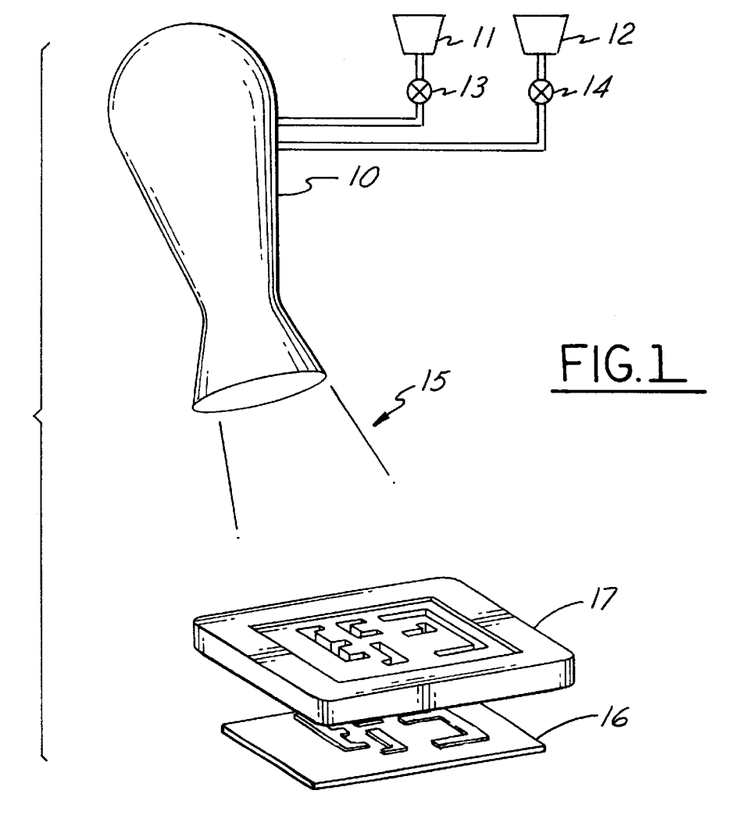
FIG. 1 is a generalized schematic diagram illustrating the thermal spray manufacturing technology used in accordance with the present invention.

FIG. 1 shows a thermal spray system for generating a thermal spray to selectably deposit insulating and conducting materials to manufacture an interconnect device. A thermal spray comprised of carrier gases and particles of selected materials is formed by heating particulates using an electric arc or chemical combustion as a heat source. The thermal spray may be comprised of a plasma spray, high velocity oxy fuel (HVOF), two-wire arc (TWA), singlewire wire, or flame spray, for example. Layered structures are formed by alternately spraying insulating and conducting particles in predetermined patterns.

A thermal spray nozzle 10 receives material to be deposited from supply bins 11 and 12. The flow of material into nozzle 10 is selectably controlled using feeder valves 13 and 14, respectively. One bin may contain particles of a conducting material (e.g., copper) while the other contains particles of an insulating material (e.g., alumina). Although a layered structure formed using material from just one bin for each respective layer is described herein, it is also possible to form graded structures wherein mixtures of materials are used for portions of a structure.

Particles are heated, propelled by a carrier gas and directed out of nozzle 10 as a thermal spray 15 for deposition. Thermal spray 15 is directed toward a substrate 16 where the desired interconnect device is to be fabricated. Deposition is limited to certain desired areas by interposing a spray mask 17 in the thermal spray particle stream prior to substrate 16. Mask 17 may preferably be laid on top of substrate 16 (i.e., the bottom of mask 17 is flush with the top of the substrate or most recently deposited layer) to provide sharp edges on the deposited features. Mask 17 may be withdrawn away from substrate 16 as thermal spray material is deposited. There is typically no problem of the mask becoming welded to the substrate since typical mask materials have surfaces that are not well suited to joining with thermally sprayed materials. Specifically, mask materials have smooth surfaces to which thermally sprayed material cannot adhere well (as described below, rough surfaces are required to get thermally sprayed layers to stick).

Alternatively, mask 17 may be spaced away from substrate 16 in a fixed location at a distance at least equal to or greater than the thickness of the layer then being deposited, This results in a device feature size different than the mask aperture dimension. Undercutting of the mask along the aperture edges can also be used to prevent the mask from attaching to the substrate. Modeling of feature size, including the effects of mask to substrate distance and undercutting, is described below with reference to FIG. 21.

By coordinated application of thermal spray 15 through respective spray masks with various patterns to deposit alternating insulating and conducting layers, an interconnect device including conductive traces, conductive vias between layers, and insulating barriers separating planes of traces is formed.

The spray masks used in the invention can be roughly divided into two general types: positive masks which are used to form conducting layers and which positively image the conductive traces in the structure, and negative masks which are used to form insulating layers and which block thermal spray substantially only in selected regions where conductive material is to remain exposed (e.g., vias, bonding pads, and test points). The resulting layers of thermal sprayed material are directly bonded together and form a monolithic, solid structure. Adjacent layers adhere to one another essentially by mechanical bonding, which is facilitated by the rough surfaces resulting from thermal spraying.

Figure 2:
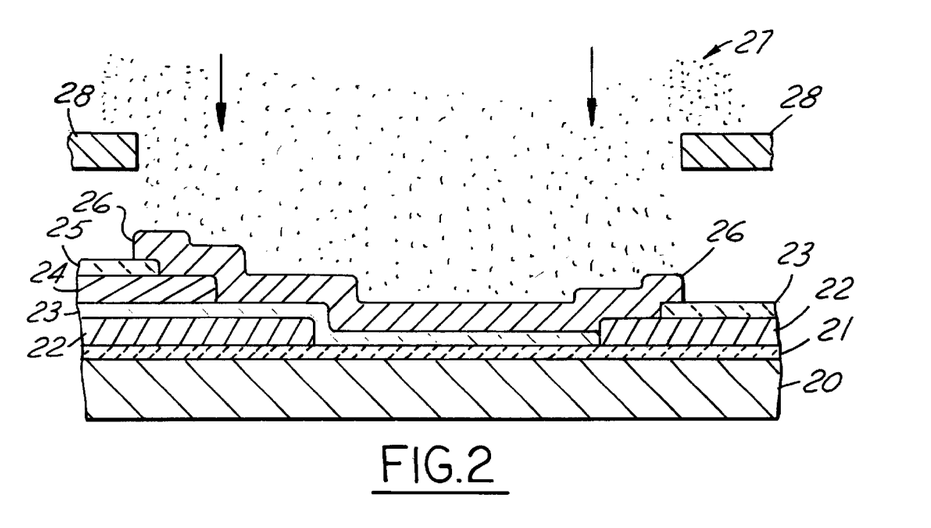
FIG. 2 is a cross-sectional diagram of an electrical interconnection device formed in accordance with the present invention.

FIG. 2 shows a cross-sectional view of the device of the present invention with multiple layers, including inter-layer electrical connections which are formed by direct metallurgical bonding between conductive material sprayed during formation of different conducting layers (i.e., at the sites of vias).

The intrinsic formation of metallurgically bonded interlayer electrical connections without reliance upon external devices provides significant cost and reliability advantages. Similarly, reliability problems associated with PWB plated-throughholes, flex circuit inter-layer connections, and solder-based inter-layer connections are avoided.

The structure of FIG. 2 is built up by thermal spraying over a substrate 20. A wrought or die cast aluminum plate provides a preferred substrate, and may comprise a wall of an enclosure for an electronic module. A planar insulating base layer 21 is deposited over substrate 20 to prevent subsequently deposited traces from being short circuited by substrate 20. If an insulating substrate is substituted, then insulating base layer 21 may not be necessary.

When aluminum is used as a substrate, the surface of the aluminum must first be cleaned for thermal spray deposition of materials because the aluminum surfaces are naturally coated with a thin layer of smooth aluminum oxide. The smooth aluminum oxide can be cleaned from the surface using a technique such as blasting with grit, etching, or spraying with a water jet. Only the underlying substrate needs such cleaning or roughening since each subsequently sprayed layer has intrinsic roughness that facilitates adherence of an overlying layer.

A first conducting layer 22 is deposited over base layer 21 in a pattern which includes open spaces between separate circuit traces. A first patterned insulating layer 23 is deposited over layer 22 in a pattern which leaves a selected region of conducting layer 22 uncovered so that at least one of its traces can be subsequently connected to other conducting layers or external components.

In the alternating structure of the device, a conducting layer 24 is deposited over layer 23 in a respective pattern of circuit traces. An insulating layer 25 covers a portion of the previous layers. A final conducting layer 26 is shown during deposition of conducting particles 27 in a thermal spray being controlled by a pattern in a mask 28. Layer 26 is deposited of the selected region to form a via between conducting layers 22 and 24. The mask patterns are further selected to form bonding pads of conducting material to facilitate external connections as is described below. A final insulating layer or other conformal coating may be provided over exposed traces for protection (while leaving bonding pads exposed). In addition to conformal coating known in the art, it is possible to thermally spray a thermosetting epoxy as a conformal coating.

Figure 3:
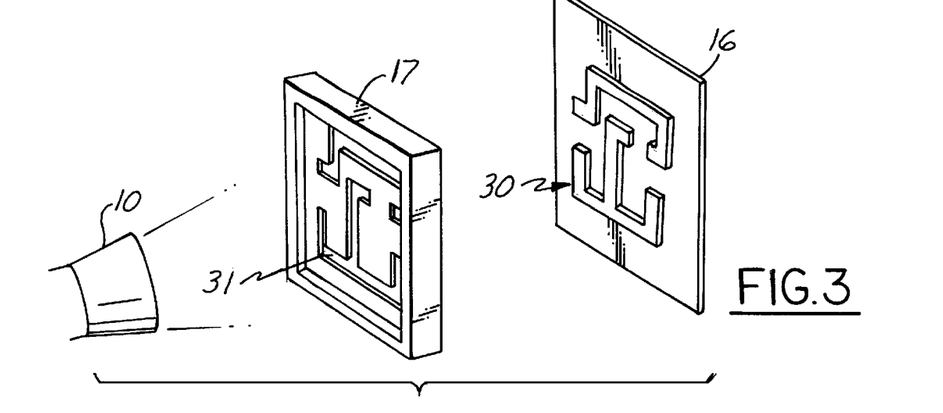
FIG. 3 illustrates a positive mask arrangement for forming a conducting layer in the structure of the present invention.
Figure 4:
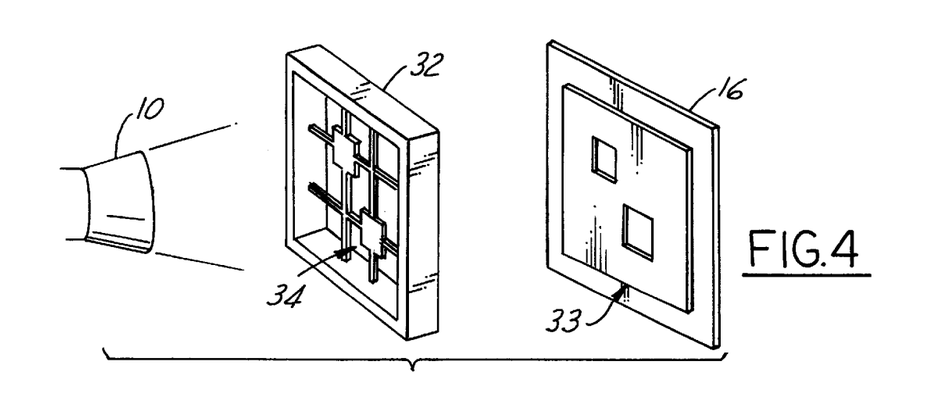
FIG. 4 illustrates a negative mask arrangement for forming an insulating layer in the structure of the present invention, wherein the layer provides vias or interconnects between conducting layers.

FIG. 3 shows the spatial relationship between nozzle 10, positive mask 17, and substrate 16 whereby a conducting layer 30 having a desired pattern is formed by virtue of a corresponding pattern 31 in mask 17. Likewise, FIG. 4 shows the spatial relationship between nozzle 10, a negative mask 32, and substrate 16 whereby a subsequent insulating layer 33 having a desired pattern is formed by virtue of a corresponding pattern 34 in mask 32.

Process parameters, such as energy input to the thermal spray (i.e., temperature), mask-to-substrate distance, particle size, and particle stream density, are controlled depending upon the desired final structure and materials selected. Particle stream density in particular can be optimized for providing sharp edges to deposited features. Since turbulence, backscattering and other interactions can cause migration of some particles outside the desired pattern, a minimum distance between adjacent conducting traces is required to avoid electrical leakage and surface breakdown depending upon the particular process parameters being used.

Figure 5:
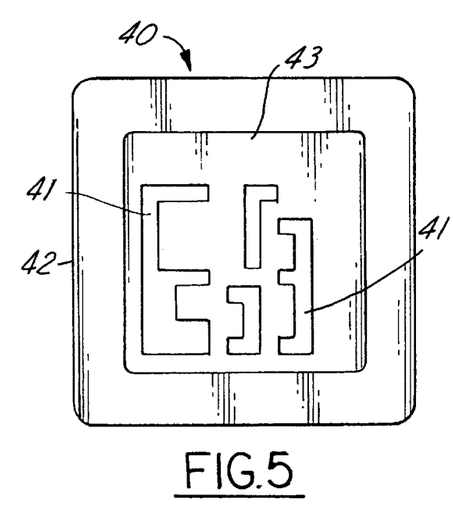
FIG. 5 shows a positive mask in greater detail.

A first embodiment of a positive mask 40 will be described with reference to FIG. 5. Apertures 41 are formed in a mask blank having a frame 42 and a central sheet 43. The mask blank may be comprised of stainless steel or beryllium copper, for example, and apertures 41 may preferably be formed by photochemical etching, but alternatively by electro-discharge machining or mechanical machining. Photochemical etching techniques are preferred because the strength of the remaining mask structure may be greater than when other machining techniques are used. A mask can thus withstand repeated production cycles without bending, deforming, warping, or otherwise deteriorating in a way that might otherwise prevent the consistent control of feature dimensions.

Figure 6:
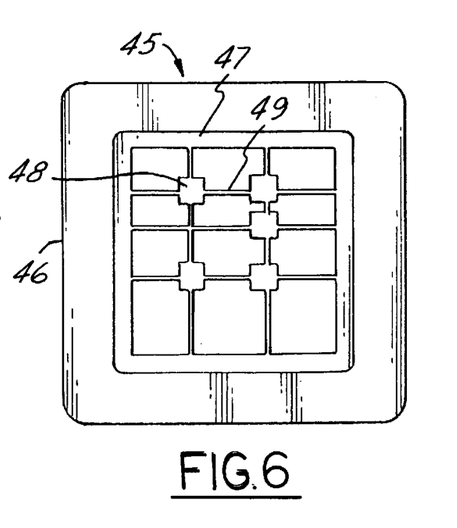
FIG. 6 shows a negative mask in greater detail.

FIG. 6 shows a photochemically etched negative mask having a frame 46 and etched central sheet 47. Blocking features 48 are supported by bridges 49. Bridges 49 are formed as small as is practical to avoid unintended breaks or significant thickness reductions in an insulating layer. Bridges 49 or other support structure which is not to appear in the deposited layer would not be laid flush on the substrate during deposition since material is to be deposited under them. Therefore, bridges 49 either do not extend to the bottom surface of the mask or the mask itself is not laid flush but is instead maintained at a height above the substrate during thermal spraying.

Figure 7:
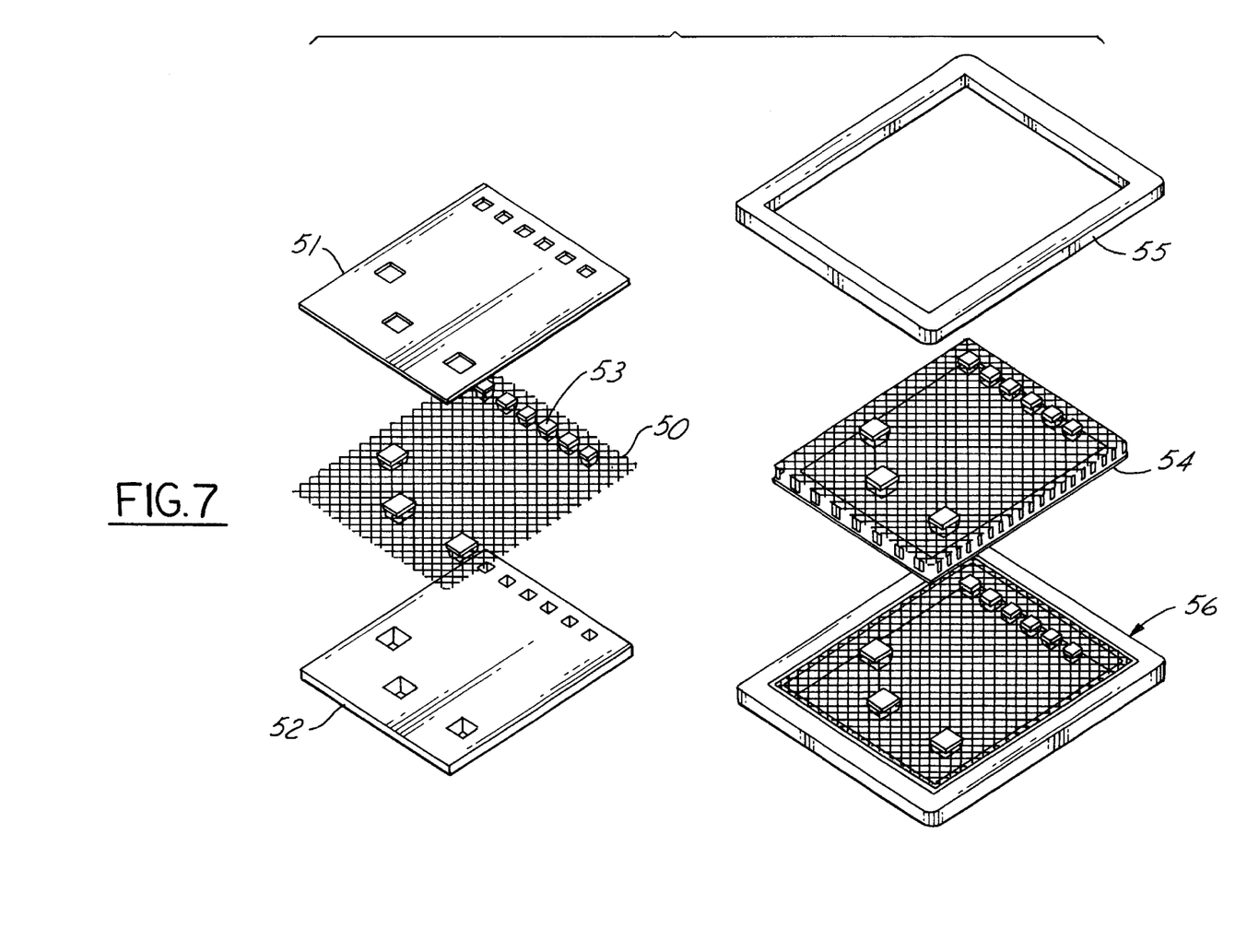
FIG. 7 illustrates another embodiment for the construction of a negative mask.

An alternative negative mask structure is shown in FIG. 7 using a screen 50 to provide a rigid support without substantial blocking of the thermal spray. In constructing a mask, upper and lower blanks 51 and 52 having apertures corresponding to the desired blocking areas of the negative mask are sandwiched around screen 50. Pre-sized blocking pieces are joined within the apertures to the upper and lower sides of screen 50 so that the blocking features are correctly located. Joining may be by silver soldering, welding, screwing together, or adhesive bonding, for example. Screen 50 with blocking features 53 is then fitted to a frame with lower frame 54 and upper frame 55 resulting in a finished negative mask 56.

Figure 8:
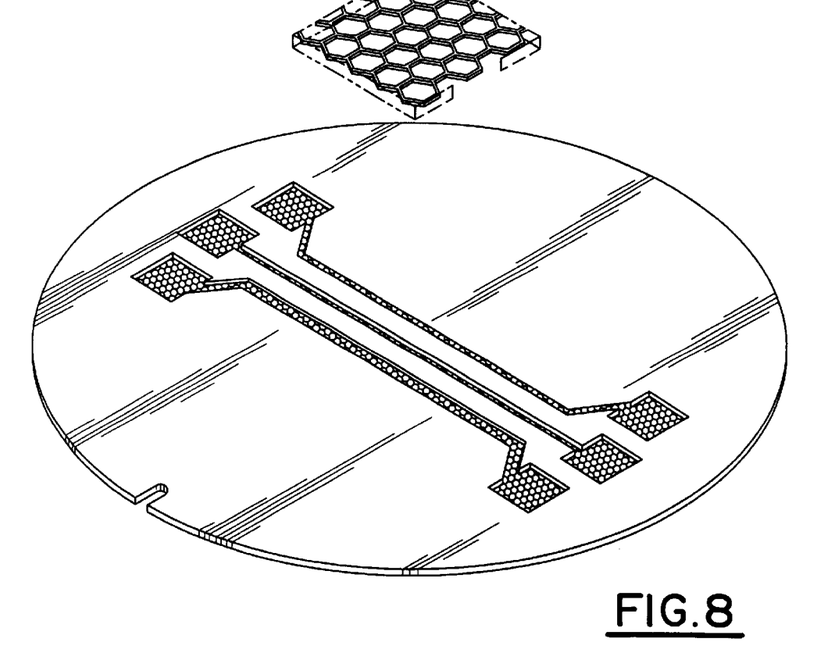
FIG. 8 illustrates another embodiment for the construction of a positive mask.

FIG. 8 illustrates a positive mask formed by the technique of FIG. 7 in which the screen takes the form of a honeycomb mesh. The honeycomb structure provides a high ratio of open area to support structure area, sometimes referred to as the packing factor or openness factor.

Using the technique of FIGS. 7 and 8, it can be seen that the thickness of the mask material can be made much greater than the thickness of the screen. This reduces the relative blocking efficiency of the screen, thus giving better defined features on the interconnect device. The relative thinness of the screen also facilitates thermal spraying through the mask at various spray angles for even coating beneath the screen areas.

Figure 9:
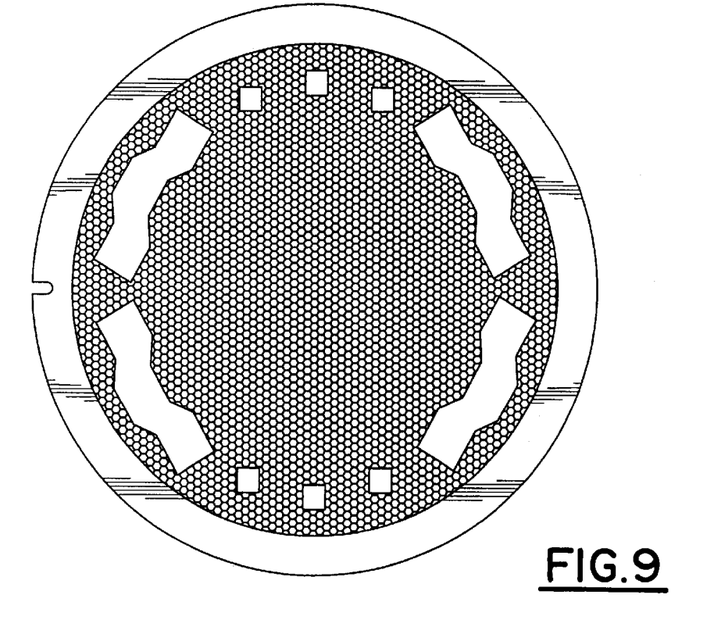
FIG. 9 illustrates another embodiment for the construction of a negative mask.

FIG. 9 shows a negative mask formed using a honeycomb mesh.

Figure 10:
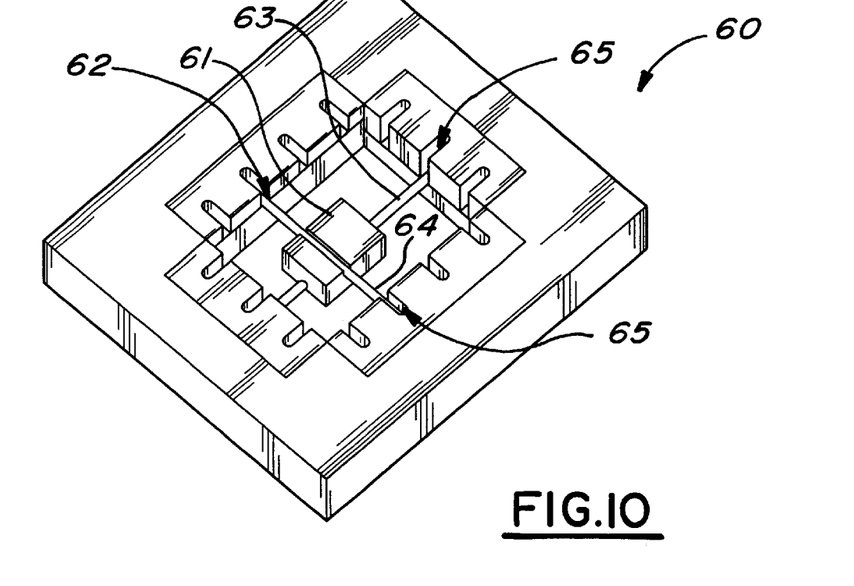
FIG. 10 illustrates another embodiment for the construction of a negative mask.

FIG. 10 shows another alternative method for the production of a negative mask 60 having a suspended shadow aperture 61. In this approach, a wire matrix 62 is utilized to form a positive-locating self-aligning suspension of shadow apertures. For example, perpendicular wires 63 and 64 held in position by frame guides 65 lock shadow aperture 61 in place by means of corresponding grooves in shadow aperture 61 which receive the wires. The wire matrix is of a fine dimension relative to shadow aperture dimensions so that the flow of particulates through the wire matrix reaches the substrate substantially unobstructed. A significant advantage of this approach is that it provides accurate control of shadow aperture locations and relatively straightforward mask fabrication. In the case of a mask having a large number of shadow apertures, however, this technique may be less useful since the multiplicity of crossing wires could force impractical machining operations in connection with the frame guides.

In depositing features using negative masks, it is necessary to avoid creating shadows of the negative mask support structures because the failure to deposit insulating material could lead to unintended short circuits between conducting layers. By making negative mask supports having a width (i.e., the support's smallest dimension in the plane of the mask) as small as possible, unintended shadowing of insulating material is also minimized. However, durability and reusability of the mask dictate that at least a minimum support width be used. To prevent shadowing in any case, the method of angle spraying or planar translation are also preferably used.

Figure 11:
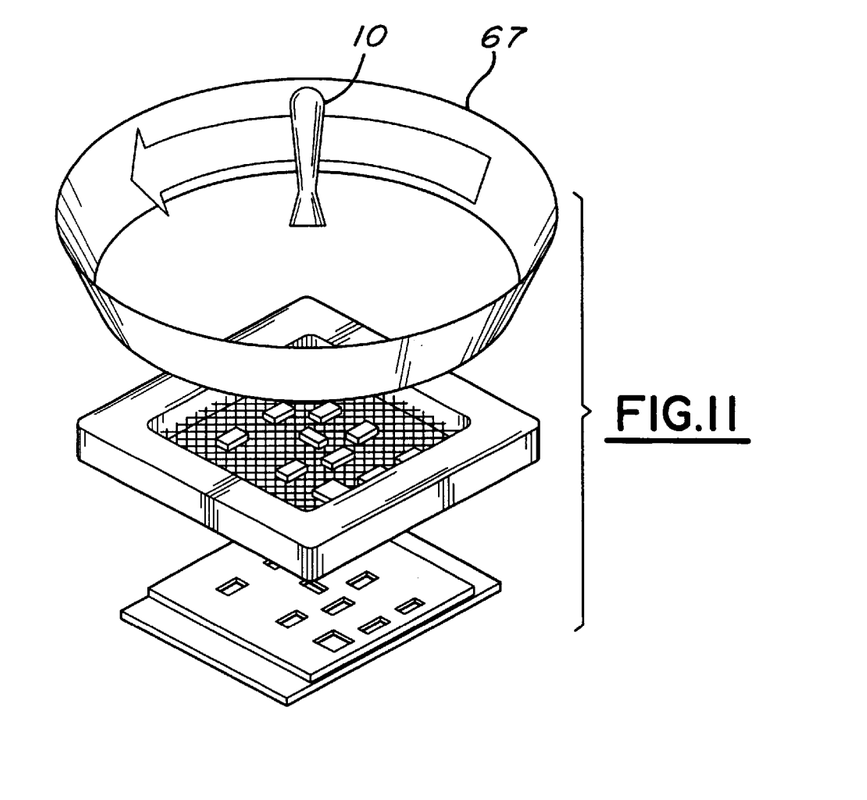
FIG. 11 is a schematic diagram showing movement of a thermal spray nozzle to increase coverage of material during processing.

In angle spraying, the thermal spray nozzle is swept through small angles relative to a direction normal to the surface of the substrate. For example, the nozzle may follow a conical path 67 during thermal spraying as shown in FIG. 11. By precessing the nozzle through a small angle, thermal sprayed material "crosses under" the supports of negative mask apertures. For example, with a negative mask having a shadow aperture 0.100 inches square and supports of width 0.010 inches, the precession angle and the distance between the substrate and negative mask can be selected to provide an actual shadowed region of about 0.080 inches on the substrate while coating all areas beneath the supports with insulating material.

In planar translation, the negative mask and/or substrate are moved relative to each other during thermal spraying by a fixed nozzle. The amount of relative movement is preferably greater than the width of the support structure, and most preferably is twice the width. In the above example with a support width of 0.010 inches, a relative translation of 0.020 inches creates the same size desired shadow region of 0.080 inches. Translation occurs across the width of each support structure. Thus, where perpendicular support structures are present, translation occurs by a suitable amount in each direction.

Whereas support structures are a necessary part of negative masks, they are also sometimes used in positive masks for added strength and durability. Angle spraying and planar translation are also used for such positive mask support structures.

Figure 12:
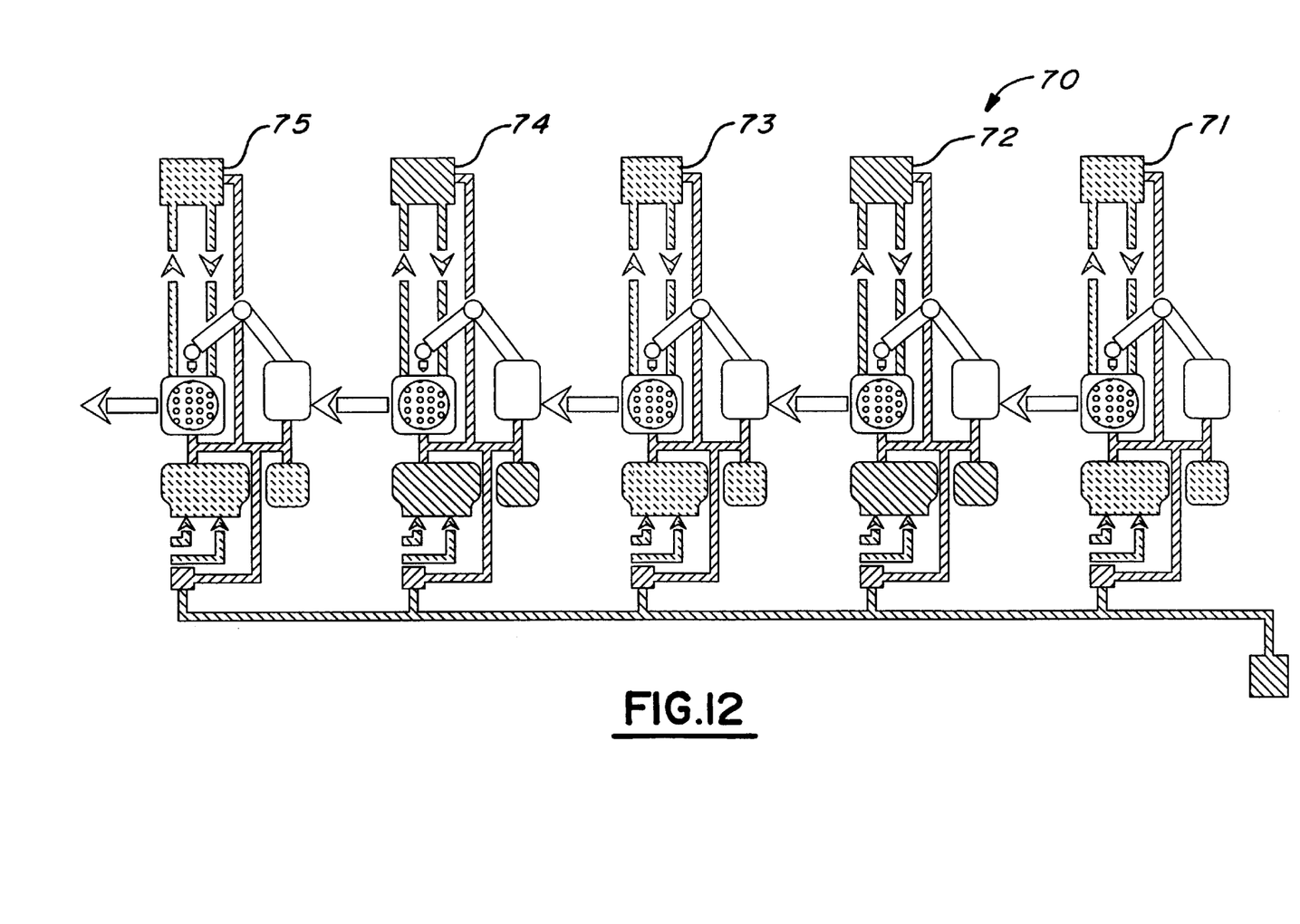
FIG. 12 is a schematic diagram of an automated manufacturing system used for the fabrication of multilayer electrical/electronic devices.

FIG. 12 shows an automated manufacturing system for the fabrication of multilayer, thermal sprayed electrical/electronic interconnect devices. Automated system 70 utilizes a serial array of thermal spray stations 71–75, each station responsible for deposition of one insulating or conducting layer. Because the system is modular, mask programmable and may employ numerous raw materials, several advantages relative to existing electrical/electronic technologies are realized. For example, a single automated system may be used to produce different electrical/electronic products by simply changing masks, and if desired, raw materials. The automated system is controlled by software, so that process controls may be modified for each product by uploading the required strategy.

Now products may be rapidly developed because spray masks may be quickly designed and fabricated using CAE and CAM methods, which translate computer generated mask drawings directly into numerically controlled machine instructions.

An automated system of thermal spray manufacture has flexibility to change process parameters such as raw materials, plasma gas flow, thermal spray powder carrier gas flow, thermal spray material flow, thermal spray composition, substrate cooling rate, substrate temperature, and layer thickness, among others.

Manufacture of devices using the present invention creates less waste in comparison to prior art technologies such as PWB or thick film technology. Other than in the low volume production of masks, no solvents (other than water), acids, etches, inks, volatile organic hydrocarbons, photoresists, bonding agents, or plating solutions are required.

Relative to existing semiconductor manufacturing technologies, such as Laser direct-write Chemical Vapor Deposition (LCVD) and existing board-level electronic module manufacturing technologies, such as PWB or thick film, the above-described thermal spray method exhibits an extremely high material deposition rate on the order of 0.001 inches per second, over surface areas up to 250 square inches. By comparison, a typical LCVD deposition rate is 0.0000254 inches per second, over a surface area of 0.0016 square inches, resulting in a thermal spray deposition rate per unit area approximately 6 million times greater than the LCVD rate. Thermal spray provides a significant competitive advantage for high volume, low cost production of electronic modules and electrical system components.

Still further, in comparison with existing technologies such as thick film and PWB, thermal spray provides significant cost and manufacturing cycle time advantages because relatively thick conductive or insulating layers necessary to meet power handling and current carrying requirements of common AED system components and AEMs are more easily produced. The multiple conductive ink deposition and bake cycles, as used in prior art thick film manufacturing, and expensive processes used to produce thick (greater than 2 ounces copper) conductive traces, employed in PWB manufacturing, are eliminated. Thermal spray may be used to produce layer thicknesses ranging from less than 0.001 inches to greater than 1.0 inch. A preferred layer thickness is about 0.007 inches is a typical automotive application. Heat build-up during spraying limits the amount of material that should be deposited in a single pass to about 0.0005 to 0.001 inches.

Thermal spray variable cost is low compared to existing technologies such as thick film, PWB or bus bar. Thermal spray technology also offers significant packaging advantages in relation to such technologies as PWB and bus bar because it can be used to produce "formed-in-place" electrical interconnection systems. In other words, the thermal spray materials are applied directly to the base package material (e.g., an aluminum module enclosure) which acts as the substrate and heat sink. This produces significant advantages in terms of cost and packaging density because separate mechanical adapters, spacers and mounting hardware, as well as the packaging volume they occupy, are eliminated.

Figure 13:
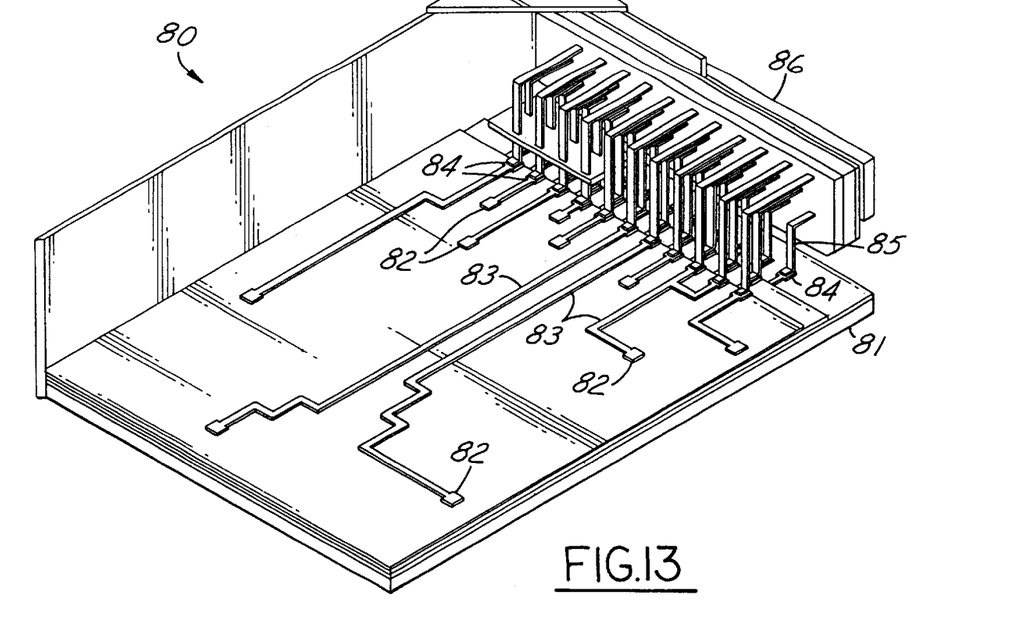
FIG. 13 is a perspective view of a finished interconnect device of the present invention.

A formed-in-place interconnect device 80 is shown in FIG. 13. A wall 81 of an enclosure acts as a substrate for deposition of alternating insulating and conducting layers. Various conducting layers include vias 82, traces 83, and bonding pads 84. Connector terminals 85 of a bulkhead connector 86 are soldered to respective bonding pads 84. Bonding pads can also be used for connection to other external devices such as various adapter terminal for terminal connections or for direct soldered connection to surface mount devices (SMDs).

The thermal-sprayed bonding pads may be formed in rows, a row corresponding to each deposited conducting layer, such that the bonding pads form multiple tiers of different heights relative to the enclosure/substrate. This tiered approach facilitates the attachment of complex, multi-terminal connectors to the multilayer electrical interconnect structure. This approach further allows the first formed electrical interconnect layers to travel beneath the subsequently formed bonding pads (without forming an electrical connection or short circuit between layers), thus facilitating high packing density and minimizing enclosure size.

Figure 14:
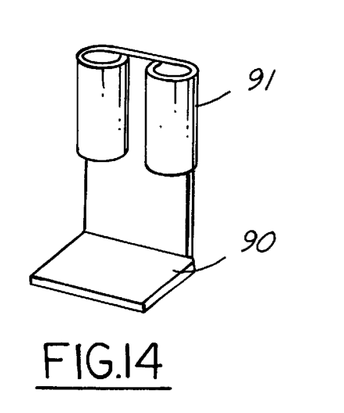
FIG. 14 is a perspective view of an offset bond pad adapter.
Figure 15:
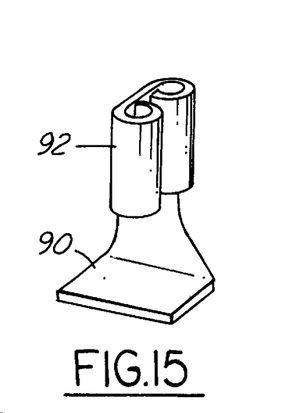
FIG. 15 is a perspective view of a centered bond pad adapter.
Figure 16:
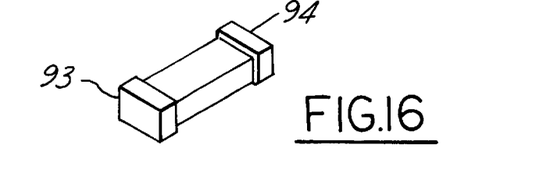
FIG. 16 is a perspective view of a surface mount device of the type that is soldered to the interconnect device of the present invention.

FIG. 14 shows an offset bonding pad adapter having a solder end 90 for soldering to a bonding pad and a terminal end 91 for connecting to a terminal blade of an electrical component or to a wire. Terminal end 91 is offset to the side of the respective bonding pad. FIG. 15 shows a centered bonding pad adapter wherein a terminal end 92 is oriented over the center of the respective bonding pad. FIG. 16 shows a surface mount device having ends 93 and 94 for soldering to respective bonding pads within an electrical circuit.

Figure 17:
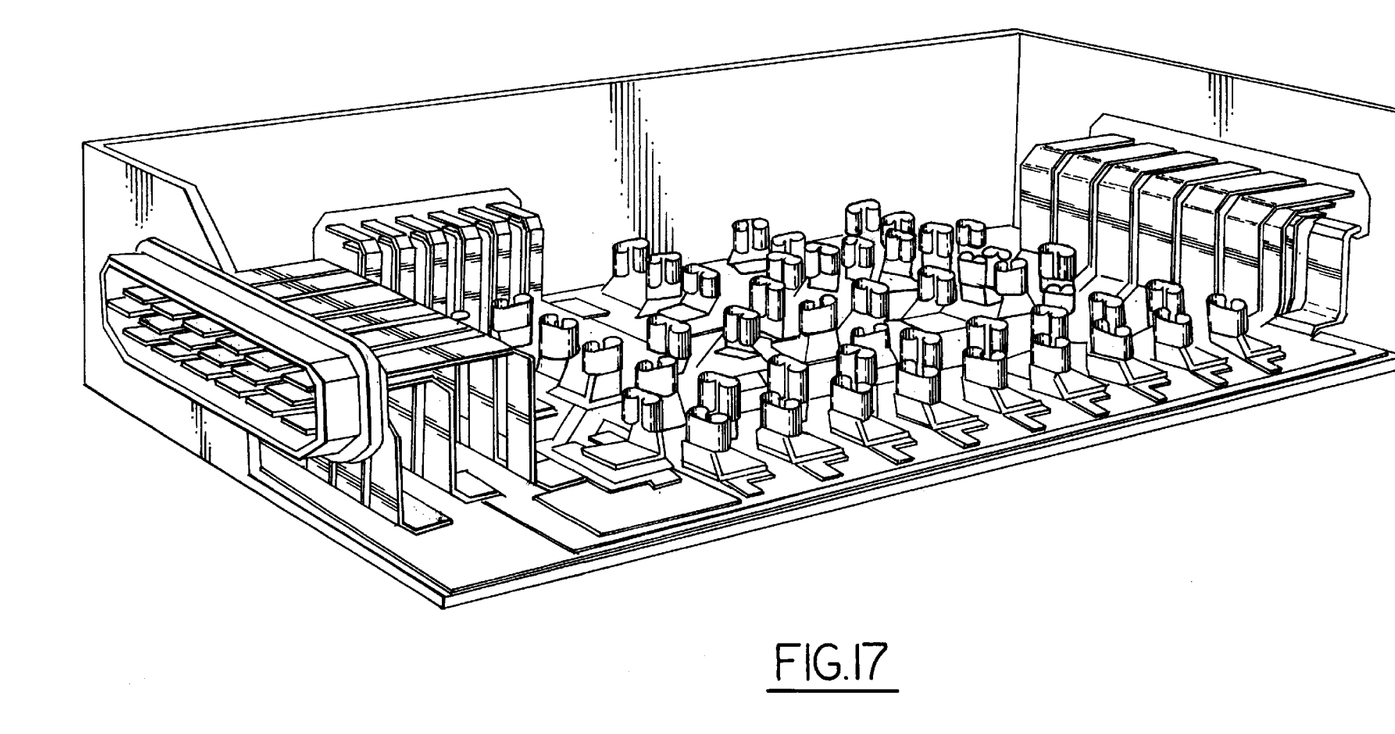
FIG. 17 is a perspective view of an interconnect device having connectors and bond pad adapters soldered thereto.
Figure 18:
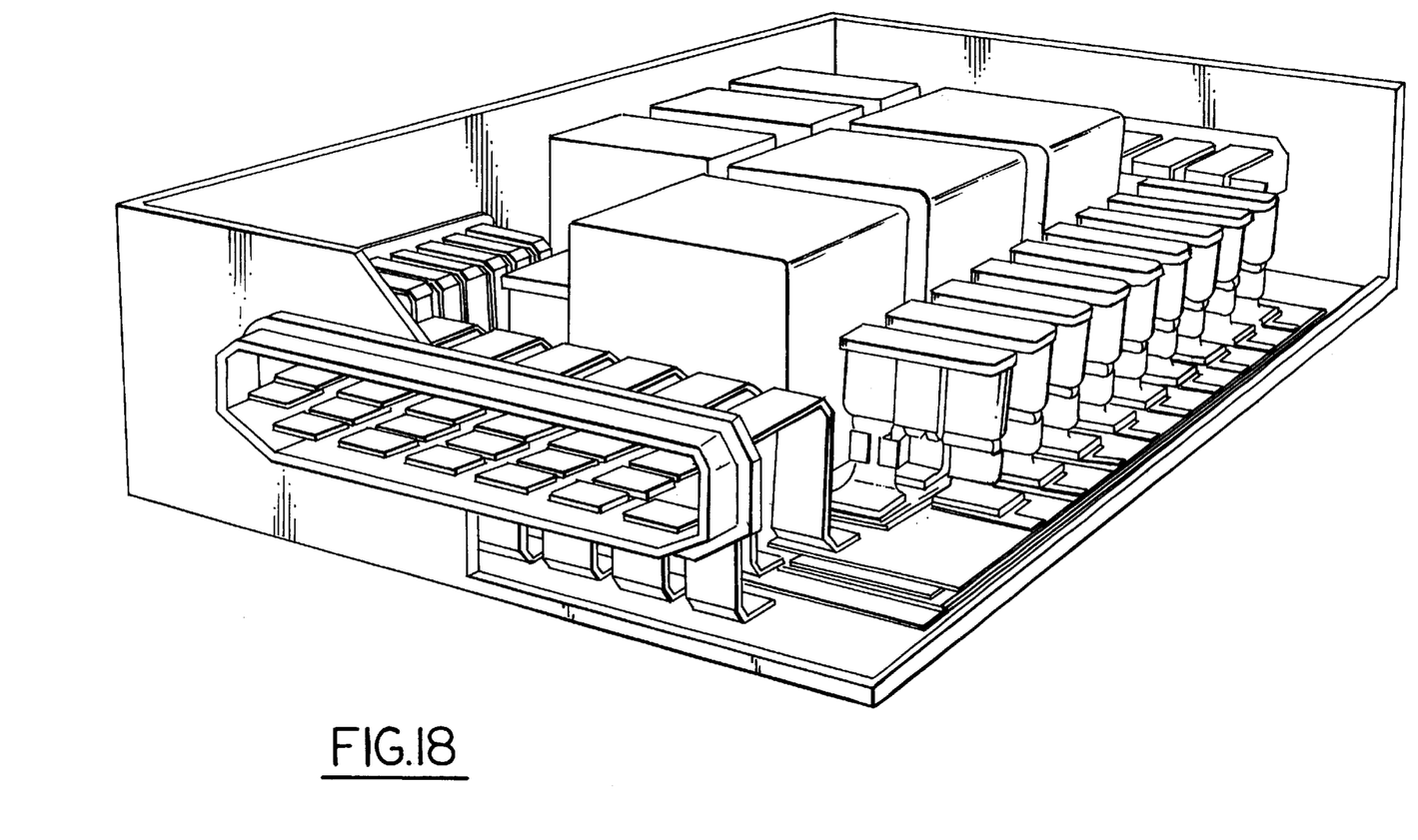
FIG. 18 is a perspective view of the device of FIG. 17 after population of components onto the bond pad adapters.

FIG. 17 shows an interconnection device having connector terminals and bonding pad adapters soldered in place prior to mounting of components in the device. FIG. 18 shows the device of FIG. 17 with relays and fuses mounted to the bonding pad adapters.

Figure 19:
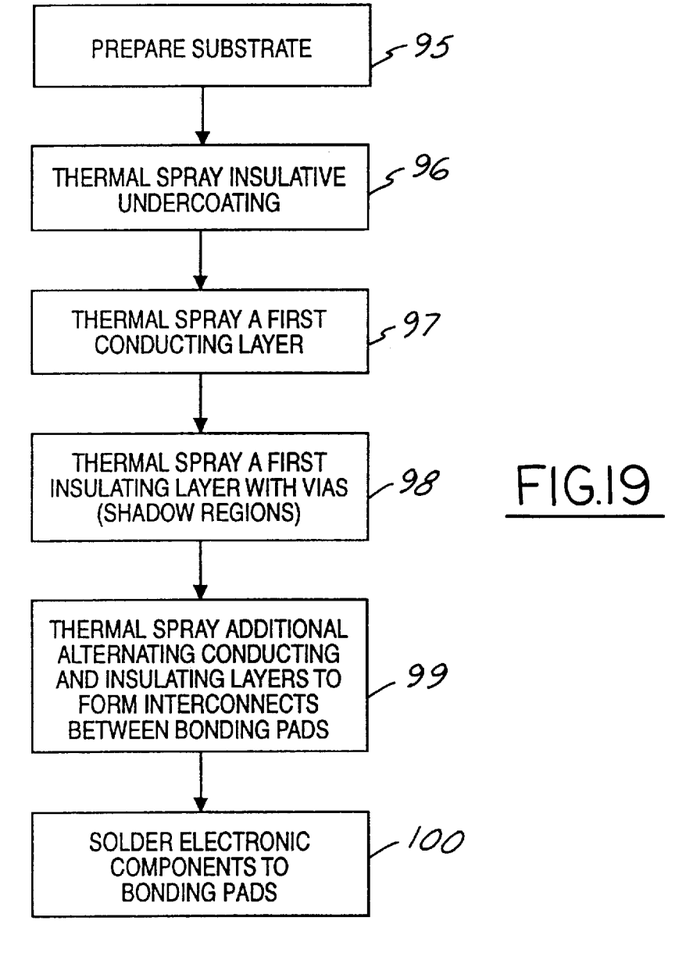
FIG. 19 is a flowchart showing a preferred method according to the present invention.

The generalized fabrication method of the invention is shown in FIG. 19. In step 95, a substrate is prepared for receiving a thermal spray. For instance, if an aluminum substrate is used then the surface must be roughened to remove the smooth layer of aluminum oxide that would prevent adherence of thermal sprayed material. Unless the substrate is comprised of an insulating material, a thermal spray insulative undercoating is deposited in step 96.

A first thermal spray conducting layer is deposited in step 97 through a mask having a first pattern. In step 98, a first insulating layer is deposited over the first conducting layer through a mask having a second pattern such that selected regions ("shadow regions") are not covered by the first insulating layer.

In step 99, thermal spray deposition is used to deposit additional, alternating conducting and insulating layers for form interconnects between bonding pads. Devices with up to four conducting layers have been fabricated with excellent results A greater number of conducting layers can be used, but the number of layers becomes limited by trace geometries and the amount of space available to form vias between layers.

In step 100, electronic components such as connector terminals, bonding pad adapters, and surface mount devices are soldered to the bonding pads.

In keeping with the invention, numerous materials are suitable for the thermal spray operation besides the copper and alumina discussed above. Material may be chosen for forming a surface suitable for direct bonding of semiconductor packages or chips; utilizing such methods as direct copper bond, eutectic die attach or conductive epoxy adhesion, etc. The direct bonding capability results in very high thermal dissipation capacity, which provides significant advantages in terms of reduced package size and cost.

Figure 20:
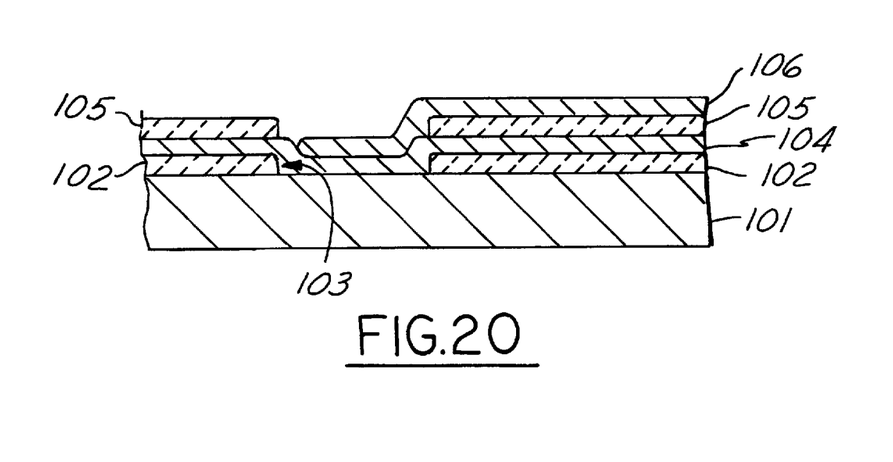
FIG. 20 is a cross-sectional view of an interconnect device using a conductive substrate to provide ground connections.

FIG. 20 illustrates an alternative embodiment of a layered structure for an interconnect device in which a conducting substrate is utilized as a ground plane through interconnection with other conducting layers. An electrically conductive substrate 101 has an insulating undercoating layer 102 deposited thereon. However, a void 103 in layer 102 leaves a portion of conductive substrate 101 exposed so that a conducting layer 104 forms a contact with substrate 101. The void area is maintained during deposit of a subsequent insulating layer 105 SO that a further conducting layer 106 can also make ground contact with substrate 101.

This alternative embodiment helps simplify the layout of a circuit by eliminating special return-to-ground traces (which may even result in a structure requiring one less conducting layer than would otherwise be necessary). Using the module base plate as a ground plane facilitates good EMI/EMC performance.

As discussed earlier, it may be desirable or necessary to suspend a mask without contacting the substrate during deposition of various features. In a preferred embodiment, an angled spray from a precessing nozzle is used. Since thermal sprayed material then follows a trajectory which is not perpendicular to the mask and substrate, a deposited feature created by material flow through a mask aperture is larger than that mask aperture (spray dispersion contributes to the enlarging affect but to a much smaller degree). It is desirable to model feature size so that a manufacturing process and masks can be designed to provide sufficient space between features.

Figure 21:
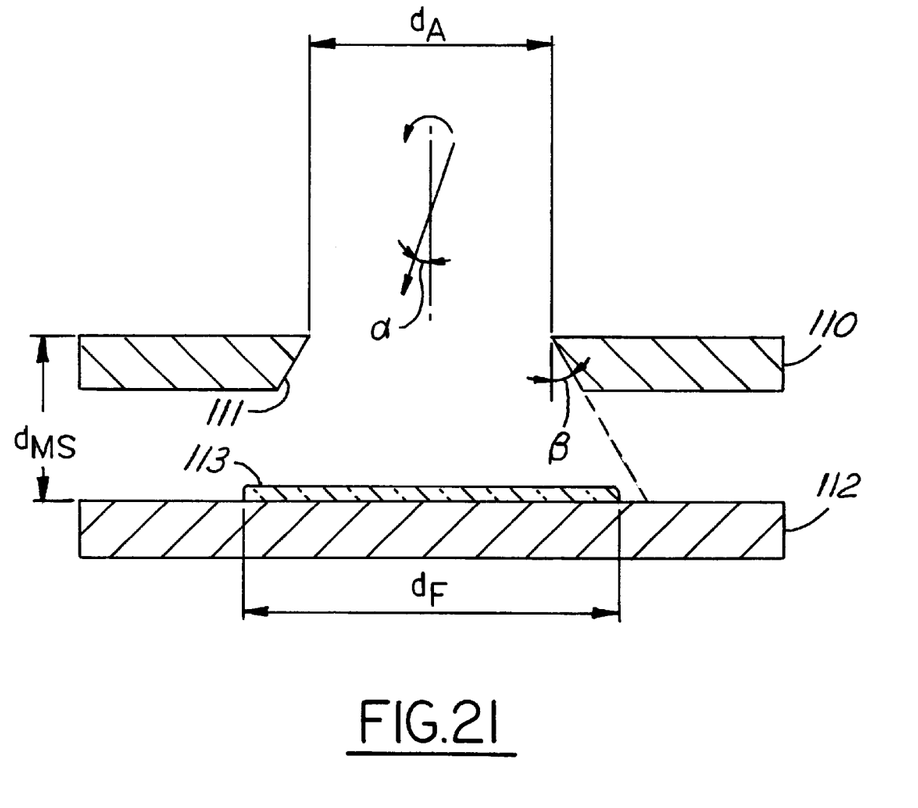
FIG. 21 is a cross-sectional view of a thermal spray aperture over a conductive layer on a substrate.

As shown in FIG. 21, a mask 110 includes an aperture with a dimension $d_A$. The aperture may further include an undercut 111 having an undercut angle $\beta$. Thermal spray is delivered by a precessing nozzle at a spray angle $\alpha$. A substrate 112 receives a deposited layer 113 having a feature dimension $d_F$. The distance between substrate 112 and the narrowest portion of the mask aperture is designated $d_{MS}$. The relationship between mask aperture size and feature size is given by:

$$d_F = d_A + 2d_{MS} \tan(\alpha).$$

Undercut angle $\beta$ would typically be greater than spray angle $\alpha$ to help prevent formation of thermal spray deposits on the undercut sides of the aperture. If angle $\beta$ is less than angle $\alpha$, then distance $d_{MS}$ would instead be measured from the bottom edge of mask 110 or whatever other portion of the aperture that most confines the thermal spray.

By way of example, a conductive copper trace 0.100 inches wide and 0.0100 inches thick is thermally sprayed onto an isoplanar substrate composed of aluminum coated evenly with an insulating layer of alumina ($Al_2O_3$). A typical spray angle of 30° C., thermal spray deposition rate of 0.0005 inches per second, and mask to substrate distance of 0.050 inches are employed. The above formula is used to determine a mask aperture size that creates the desired feature dimension. Thus;

$$d_A = d_F - (2d_{MS} \tan(\alpha)) = (0.100) - 2(0.050)\tan(30° \text{ C.}) = 0.0732 \text{ inches}$$

The precession angular velocity of the nozzle should be sufficient to complete two full cycles during the deposition process to ensure there are no unintended voids under any support structures of the mask.

For subsequently sprayed layers, the thickness of previously sprayed layers may vary across the device. Therefore, the mask to substrate distance $d_{MS}$ may be different when using the previous formula for obtaining various mask dimensions at various areas within a single mask.

What is claimed is:

1. An interconnect device for interconnecting electronic components comprising:

a substrate;

a first conducting layer including conductive traces deposited over said substrate in a first pattern by thermal spraying;

a first insulating layer deposited over said first conducting layer by thermal spraying in a second pattern not including selected regions of said first conducting layer, said first insulating layer adhering to said first conducting layer by mechanical bonding as a result of thermal spraying; and a second conducting layer deposited over said first insulating layer and said first conducting layer by thermal spraying in a third pattern including at least one of said selected regions, said second conducting layer adhering to said first insulating layer by mechanical bonding as a result of thermal spraying;

whereby said selected regions provide interconnects between conducting layers through direct metallurgical bonding.

2. The device of claim 1 further comprising:

a second insulating layer disposed between said substrate and said first conducting layer, said second insulating layer adhering to said substrate amd to said first conducting layer by mechanical bonding as a result of thermal spraying.

3. The device of claim 1 further comprising additional alternating insulating and conducting layers deposited over said second conducting layer by thermal spraying in respective patterns.

4. The device of claim 1 wherein said conducting layers include bonding pads for connecting to said electronic components.

5. The device of claim 4 further comprising connector terminals soldered to respective ones of said bonding pads.

6. The device of claim 4 further comprising surface mount devices soldered to respective ones of said bonding pads.

7. The device of claim 4 further comprising adapter terminals soldered to respective ones of said bonding pads.

8. The device of claim 1 wherein said substrate is comprised of conducting material connected to ground and wherein at least said first conducting layer is electrically connected with said substrate.

* * * * *